United States Patent [19]

Chaki

[11] 4,079,631

[45] Mar. 21, 1978

[54] 5-10 PUSHBUTTON TUNER

[75] Inventor: Takao Chaki, Urawa, Japan

[73] Assignee: Clarion Co., Ltd., Tokyo, Japan

[21] Appl. No.: 680,458

[22] Filed: Apr. 26, 1976

[30] Foreign Application Priority Data

| | | |
|---|---|---|
| Apr. 28, 1975 | Japan | 50-50816 |
| Jul. 18, 1975 | Japan | 50-99064 |
| Jul. 22, 1975 | Japan | 50-100917[U] |
| Aug. 29, 1975 | Japan | 50-118122[U] |
| Oct. 14, 1975 | Japan | 50-139056[U] |

[51] Int. Cl.² ............... F16H 35/18; H03J 5/04
[52] U.S. Cl. ................. 74/10.33; 74/10.27; 334/7
[58] Field of Search ........... 74/10.33, 10.27, 10.35, 74/10.31; 334/7

[56] References Cited

U.S. PATENT DOCUMENTS

| | | | |
|---|---|---|---|
| Re. 27,179 | 9/1971 | Newman | 74/10.27 |
| 3,415,129 | 12/1968 | Stamm | 74/10.33 |

Primary Examiner—Irwin C. Cohen
Attorney, Agent, or Firm—Wallenstein, Spangenberg, Hattis & Strampel

[57] ABSTRACT

A dual band pushbutton tuner comprises a frame, a plurality of actuating members each having a pushbutton, the actuating members being capable of sliding with respect to the frame, a pair of follow-up members arranged on both sides of each actuating member, a toggle lever articulately mounted to each actuating member at a position adjacent to the pushbutton, and shift means for pivotally moving all of the toggle levers at the same time to insert the toggle levers into notches in the follow-up members on either side to couple the actuating members to the follow-up members. Means are provided for positionally fixing and maintaining the toggle lever of any actuating member in its inserted state comprising holding means constructed so that the toggle lever of each actuating member slides on the associated and uncoupled follow-up member as the actuating member is operated.

3 Claims, 35 Drawing Figures

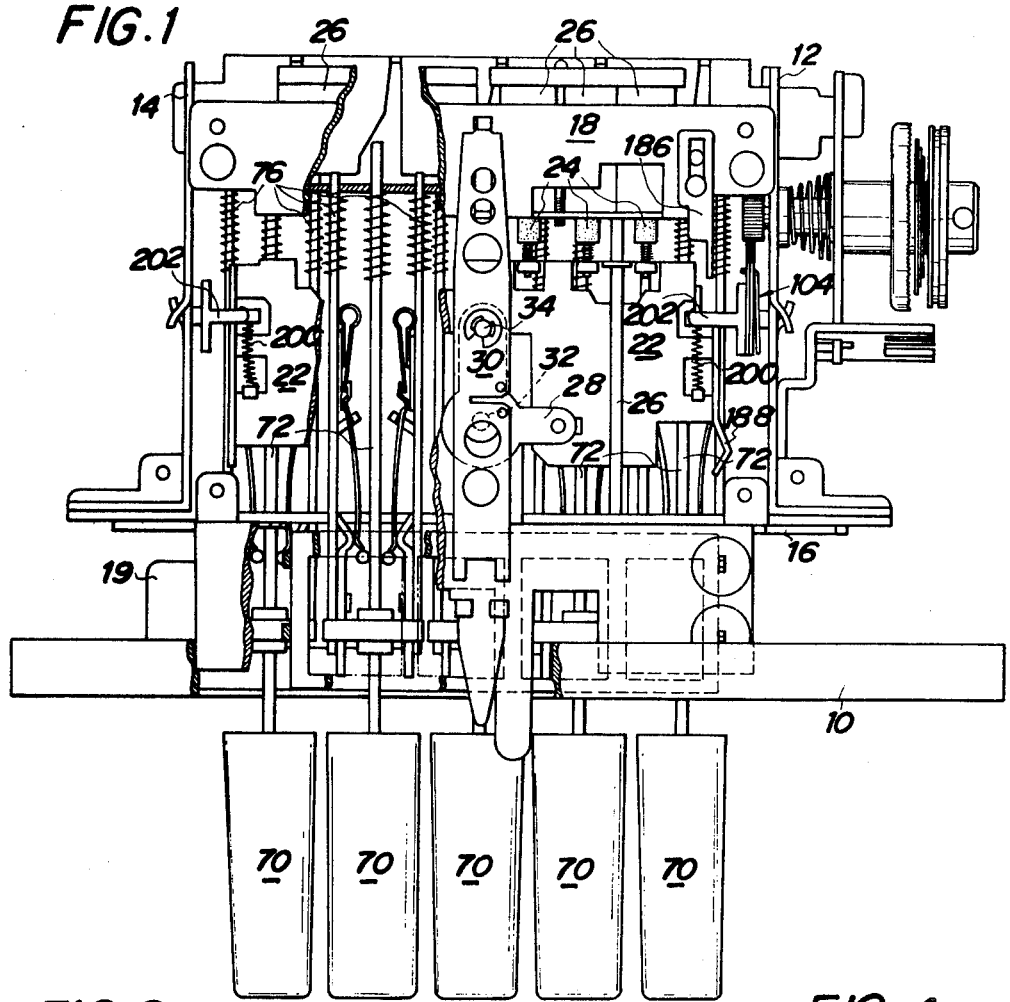
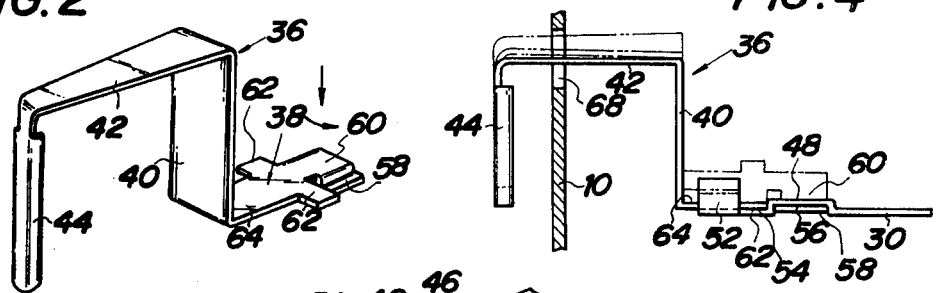

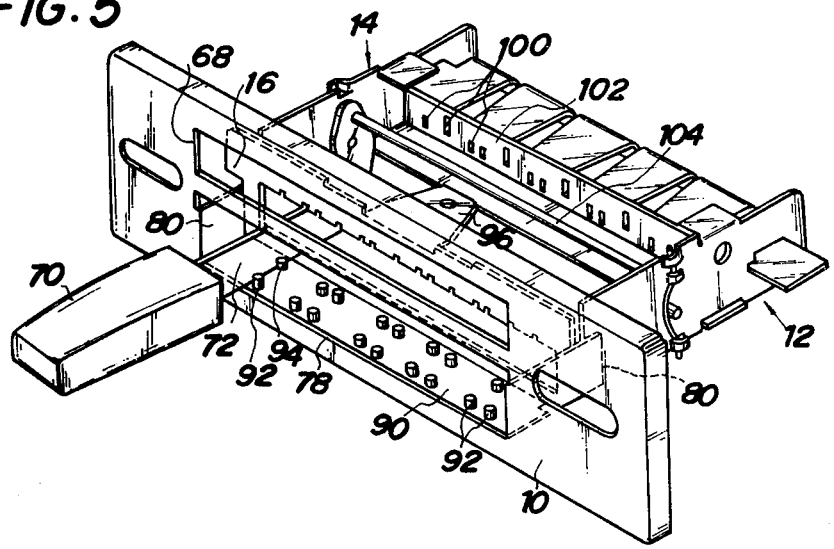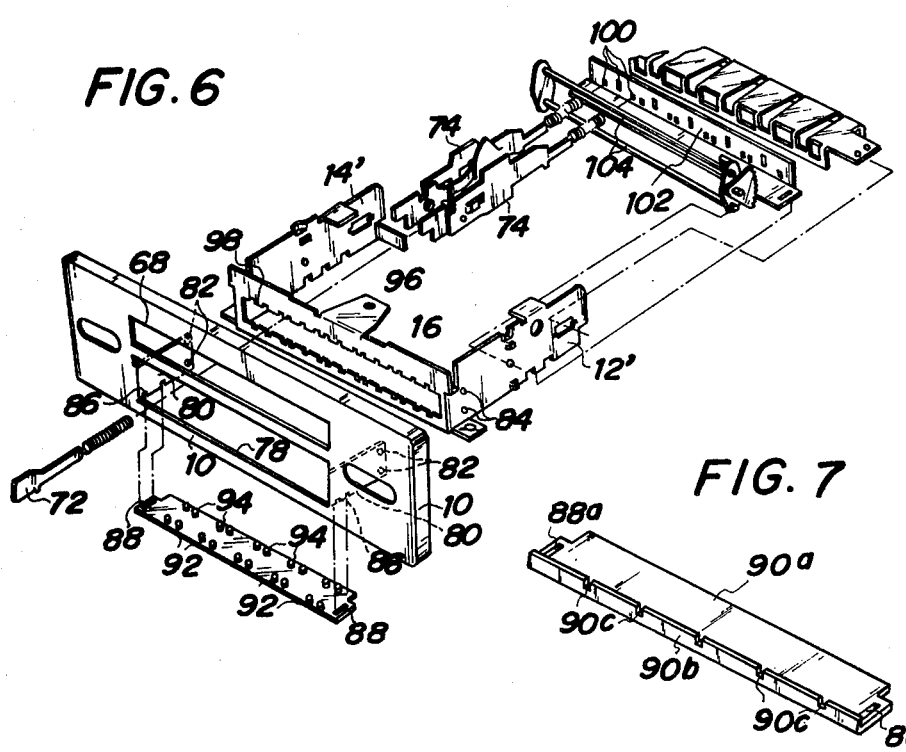

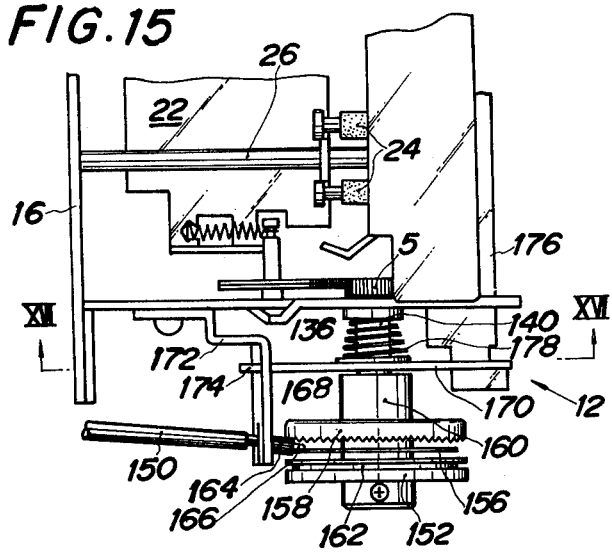
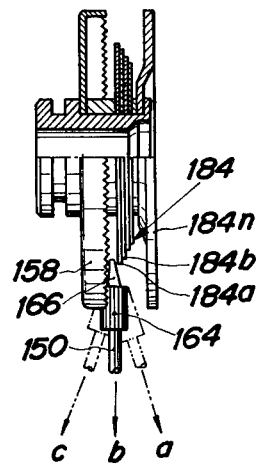
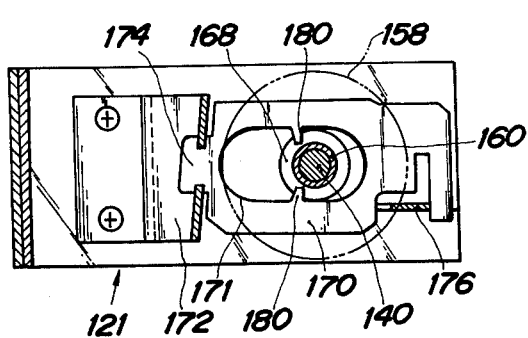
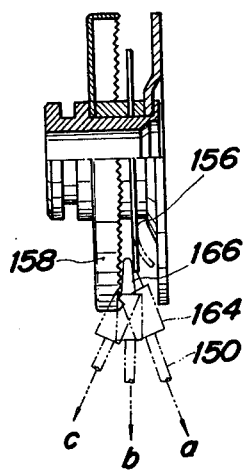
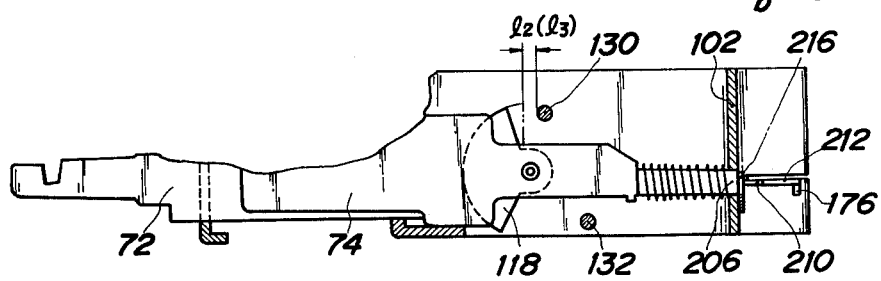

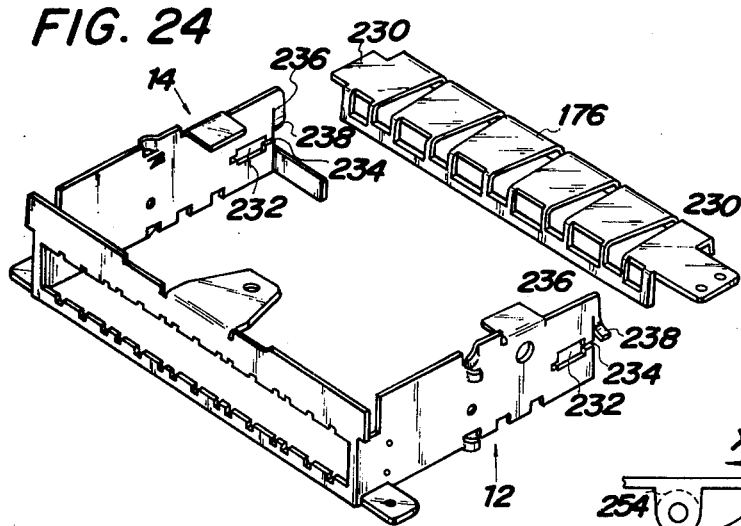
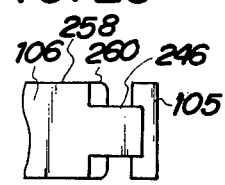
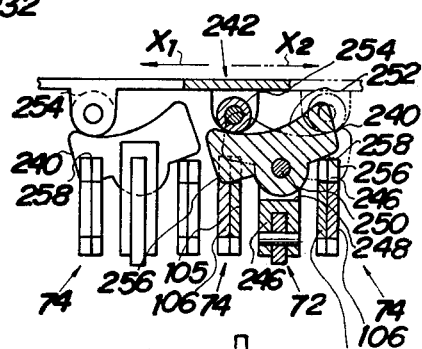
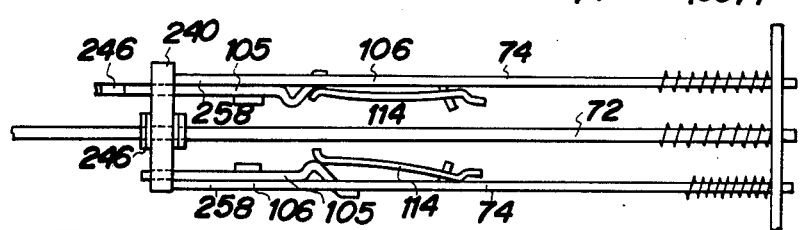
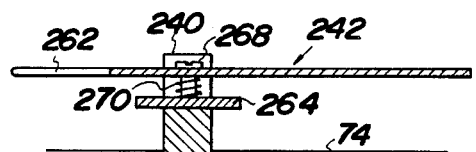
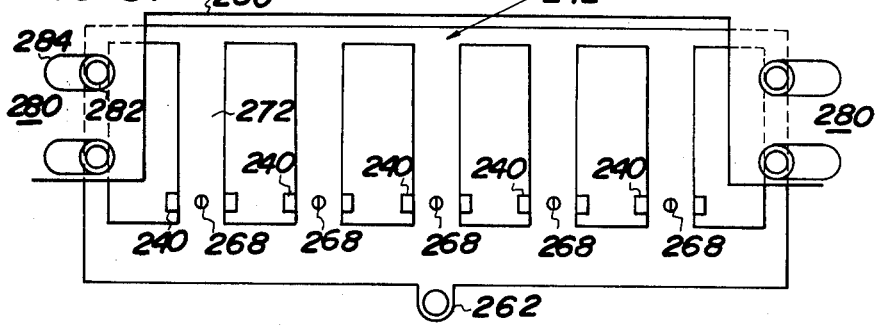

5-10 PUSHBUTTON TUNER

BACKGROUND OF THE INVENTION

This invention relates to a pushbutton tuner, and more particularly to what is called a 5-10 pushbutton tuner. A 5-10 pushbutton tuner means a tuner wherein five pushbuttons are, in one mode of operation, used for selecting AM broadcast stations and, in another mode of operation, used for selecting FM broadcast stations, it being possible, with five pushbuttons, to select the maximum five different AM broadcasts and the maximum five different FM broadcasts.

This type of tuner is disclosed and claimed in, for example, Newman U.S. Pat. No. 3,357,264 (Re. 27,179) and Stamm U.S. Pat. No. 3,415,129.

Generally, this type of device has slide actuating members with pushbuttons mounted thereto respectively and which slide in response to the push-in of the respective pushbuttons. Each of said actuating members is provided on both sides thereof with follow-up members either of which can be selectively engaged with the actuating member to slide with the sliding thereof. The follow-up member has a frequency defining cam mounted thereto, which, upon sliding with the actuating member, sets the tuning mechanism to a frequency to be determined depending upon the setting state of said cam. If five actuating members are provided, then a total of ten follow-up members are to be provided, of which five, for example, on the right sides of the actuating members are associated with the tuning mechanism so as to cause it to carry out tuning in one band (AM or FM broadcasts), and the five follow-up members on the left sides of the actuating members are associated with the same tuning mechanism so as to cause it to carry out tuning in another band (FM or AM broadcasts). Means is provided for manually engaging the actuating members with the follow-up members for tuning in each band. This broadcast band manual selecting means engages all of the actuating members with the respective follow-up members on the right side or the left side in accordance with a broadcast band to be selected.

In the Newman patent, this broadcast band manual selecting means comprises a toggle lever articulately mounted on the upper part of each actuating member and a slidable gate which manually selectively engages all of the toggle levers with the follow-up members on the right side or the left side for one broadcast band at the non-push-in (non-sliding) position of the actuating members. The slidable gate has switching fingers for pivotally moving the toggle levers, said switching fingers corresponding in number to said toggle levers. Upon shifting the slidable gate to the right (viewing the tuner from the front), the respective switching fingers engage the toggle levers with the follow-up members on the right side, and, upon shifting the slidable gate to the left, the respective switching fingers are engaged with the follow-up members on the left side. This "engagement" is achieved by the respective end portions of the toggle levers being inserted in the slots for receiving the follow-up members on the right side or the left side respectively. If, in the state of the actuating member thus having been engaged with the follow-up member on the right side or the left side for either of the broadcast bands, any optional one actuating member slides so as to be pushed in for station-selecting purposes, then the follow-up member which is engaged therewith also slides together, and, in accordance with the position where the cam of said follow-up member has been set, the tuning mechanism sets a specific state of tuning.

The Stamm patent, in view of the Newman patent wherein, in the tuner thereof, since there was no means to forcibly engage a toggle lever with a follow-up member while sliding one actuating member and maintain such engagement, though this engagement would not be released during the sliding of the follow-up member, there occurred shifting of the position of the follow-up member, so that there was a likelihood that correct tuning could not be achieved, uses connecting parts having locating portions in place of the toggle levers of the Newman patent. The respective connecting parts are articulately mounted to the respective actuating members, and the respective locating portions of said connecting parts are received in the respective slots in the shift means which corresponds to the slidable gate of the Newman patent. During the sliding movement of the actuating member, the locating portion is compelled to move within the slot in the shift means, so that the locating portion or the connecting part is caused to follow a limited path defined by said slot. At one position of the shift means such that the shift means engages the connecting parts with the follow-up members on either side, a part of the respective connecting parts are inserted "tightly" into the notches in the respective follow-up members. This state of "tight" insertion can be maintained so long as, during the sliding of the actuating member, the connecting part which moves together with said actuating member moves the locating portion thereof along the limited slot path. This construction settles the problems in the tuner of the Newman patent, that is, the likelihood that, during the sliding of the actuating member, that is, at the time a given pushbutton is pushed in, the toggle lever of the actuating member will be released from the engagement with the actuating member and the likelihood that there will occur shifting of the position of the follow-up member so that the tuning cam thereof will establish a state of erroneous tuning.

In the apparatus of the Stamm patent, since in manually shifting the shift means for broadcast band setting, it is necessary to engage the connecting parts "tightly" with the follow-up members for the selected broadcast band, and so the aid of some means is required for establishing such state of "tight" engagement. This means is a projection on the bottom of each connecting part which provides a resilient detect action. Once this state of "tight" engagement is established, it follows that it can be maintained so long as the locating portion of the connecting part passes the limited path within the slot in the shift means, during the sliding movement of the actuating member.

However while a given pushbutton is depressed one actuating member slides together with one selected follow-up member, and the shift means freely moves in the direction of its shifting movement. Such movement of the shift means during the sliding movement of the actuating member prevents the desired "tight" engagement of the associated connecting part and causes shifting in position of the sliding follow-up member which sometimes causes erroneous tuning. Also, there occurs the case, too, where the movement of the shift means during the sliding of the follow-up member causes the connecting part to come out of the notch in the follow-up member, in which case said follow-up member returns to its original non-slide position due to a resilient action. Accordingly, it is necessary to avoid the above-mentioned problems of the tuner of the Stamm patent.

SUMMARY OF THE INVENTION

This invention resides in avoiding the above-mentioned disadvantages of the Stamm patent while retaining the above-mentioned advantages of the Newman patent. According to this invention, a toggle lever is provided pivotally mounted to each actuating member, said toggle lever being adopted to be pivotally moved by shift means so as to be engaged with a follow-up member on either side with respect to the actuating member, and means provided on a follow-up member on the other side which is not moved with the actuating member concerned, said means being adopted to be contacted with the toggle lever of said actuating member at the time of the movement of said toggle lever that follows the sliding movement of said actuating member to thereby engage said toggle lever "tightly" with said follow-up member on one side and maintain this engaged relationship therebetween.

Accordingly, in this invention, the toggle lever is engaged with two follow-up members during the sliding in and out of the actuating member associated therewith. One engagement of the toggle lever is achieved by a part thereof being inserted into a notch in the follow-up member on one side, and the other engagement is effected by another part of said toggle lever being contacted physically with the follow-up member on the other side. Said other engagement is achieved by the slide contact of the toggle lever due to its moving together with the actuating member. The toggle lever maintains said one engagement "tightly" by said other engagement during the movement of the associated actuating member. This state of tight engagement is not adversely affected by a positional displacement of the shift means as in the case of the above-mentioned Stamm patent, so that accurate tuning is possible at all times.

Further, in this invention, means is provided for preventing the shift means from being shifted in the direction of tuning in another band during the sliding movement of a given actuating member. This means can be formed in a very simple mode by a part of the shift means and a part of the toggle lever locked positionally in the above-mentioned two states of engagement at the time of movement. The movement of the shift means is prohibited by said part thereof being contacted with the toggle lever in said positionally locked state.

Accordingly, according to the tuner of this invention, the movement of the shift means is possible only at a position where all of the actuating members are inoperative, that is, a position where all of the pushbuttons are held unpressed. If the position of the actuating member where the follow-up member is brought into a tuning position is taken as an operative position of the actuating member, then, at the time of the movement thereof between its inoperative and operative positions the shift in the direction of another band selection of the shift means is prohibited, and, the associated toggle lever tightly positions and maintains the follow-up member on one side with respect to the follow-up member on the other side and the actuating member. Therefore, with this invention, the above-mentioned disadvantages of the Stamm patent are avoided in a very desirable mode.

BRIEF DESCRIPTION OF THE DRAWING

FIG. 1 is a top plan view, partially cut away and partially broken, showing a 5–10 pushbutton tuner of one embodiment of this invention;

FIGS. 2–4 are views showing an indicator mechanism;

FIGS. 5–7 are views showing how to mount an actuating member and follow-up members;

FIGS. 15 and 16 are views showing another manual rotation tuning control mechanism section;

FIGS. 17 and 18 are views showing still another manual rotation tuning control mechanism section;

FIGS. 19–23 are views showing a mechanism for rendering the manual rotation tuning control mechanism inoperative when a pushbutton is operated;

FIGS. 24–26 are views showing means for mounting the mechanism shown in FIGS. 19–23; and FIGS. 27–31 are views showing a broadcast band selecting mechanism.

DESCRIPTION OF PREFERRED EMBODIMENTS

Figure 8:
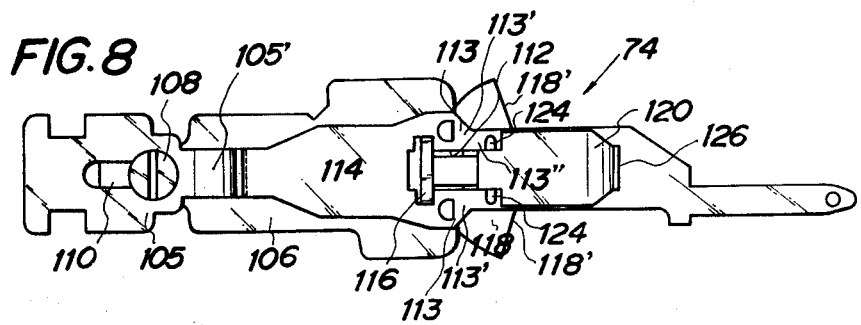
FIGS. 8–13 are views showing the construction of a follow-up member.

The illustrated pushbutton tuner of one embodiment of this invention is generally constructed of a support section, a tuning mechanism section, a pushbutton tuning mechanism section, a manual rotation tuning control mechanism section, and a broadcast band selecting mechanism section.

In FIG. 1, the support section consists of a front case portion 10, side case portions 12, 14 and 16, a rear upper case portion 18, and a front lower case portion 19. The side case portions 12 and 14 have mounted therebetween the front case portion 10, the side case portion 16, the rear upper case portion 18 and the front lower case portion 19.

The tuning mechanism section includes six tuning inductances fixedly mounted to the rear upper case portion 18 and six $\mu$-tuning cores 24 which are fixedly mounted to a carriage 22 and which are telescopically adjustably positioned within said tuning inductances respectively. The carriage 22 is moved in such a mode as will be stated hereinafter along two rods 26 (only one illustrated) provided between the side case portion 16 and the rear upper case portion 18, and, in a well-known mode, tuning becomes possible. A crank 28 pivotally mounted at 32 to the side case portion 16 and an arm 30 pivotally mounted at 34 to said crank 28 constitute a tuning indicator mechanism.

FIGS. 2 and 4 show the details of a tuning indicator mechanism. The shape of the free end of arm 30 is shown in FIG. 3. To said free end, an indicator member 36 as shown in FIG. 2 is mounted without using any fixing means such as a screw or the like. FIG. 4 shows the state of an indicator 36 having been mounted on the free end portion of the arm 30. The indicator member 36 consists of a coupling portion 38, a vertical portion 40, a horizontal portion 42 and a vertical indicator portion 44. The indicator portion 44 moves in the lateral direction in FIG. 1 on the front case portion 10 when the arm 30 pivotally moves about 34. The free end of the arm 30 is provided with somewhat uprising two branch portions 48 which define an opening portion 46, an engaging surface portion 50 and vertical portions 52 at both ends of said engaging surface portion 50. A concave 54 is formed between the vertical portion 52 and the somewhat uprising branch portions 48. A concave 56 is formed between the two branch portions 48. The coupling portion 38 of the indicator member 36 has a portion 60 having a flange 58 which is on a somewhat lower level than the plane of said coupling portion 38 and a portion 64 having two lateral projecting portions 62.

The horizontal portion 42 of the indicator member 36 passes through a lateral opening 68 in the front case portion 10. In superposing the indicator member 36 on the free end portion of the arm 30, at first, the coupling portion 38 of the indicator member 36 is somewhat shifted to the left on the free end portion of the arm 30, and then, in that state, as shown with an arrow in FIG. 2, the indicator member 36 is moved so that the flange 58 enters the concave 56 on the right side. In this state, as shown in FIG. 4, the portion 64 of the coupling portion 38 of the indicator member 36 is superposed, in the state of the projecting portion 62 having extended from the concave 54, upon the engaging surface portion 50 of the free end of the arm 30. Accordingly, the movement in longitudinal direction of the arm 30 is prohibited by the projecting portion 62 having been received within the concave 54, and, also, the movement in lateral direction is prohibited by the portion 64 having been received within a concave defined by the vertical portions 52 and the engaging surface portion 50.

Referring to FIG. 1 again, the carriage 22 is moved for tuning-setting by the action of either the pushbutton tuning mechanism section or the manual rotation tuning control mechanism section.

The pushbutton tuning mechanism section has preferably five pushbuttons 70 arranged in lateral direction. Each pushbutton is fixedly mounted to the end portion of an actuating member 72. Upon a pushbutton being pressed for station-selecting purposes, the actuating member associated therewith slides in longitudinal direction together with a pair of follow-up members 74 (FIG. 6) provided on both sides thereof.

FIGS. 5-7 show in what mode an actuating member 72 and follow-up members 74 are mounted to the support section. In FIG. 5, the front case portion 10 has two longitudinally arranged openings 68 and 78. The actuating member 72 extends through the opening 78. In this FIG. 5, for the purpose of clarification, one actuating member 72 and one pushbutton 70 are shown. In the embodiment shown in FIGS. 5 and 6, on both sides of the opening portion 78, there are right-angled bent portions 80 provided to face with each other. In the vicinity of the free ends of said facing right-angled bent portions 80, there are holes 82 provided, which holes 82 are in registration with the corresponding holes 84 in a part 12' and a part 14' of the respective side case portions 12 and 14, the front case portion 10 being mounted to the support section by means of screws (not shown) passing through said holes. As shown in FIG. 5, the front case portion 10 is mounted spaced apart from the side case portion 16 by the right-angled bent portions 80. A holding plate 90 is mounted below the right-angled bent portions 80 by the engagement of the projecting portions 86 thereof with the slots 88 in said holding plate 90. On the upper surface of the holding plate 90, there are provided four projections per actuating member, the actuating member 72 sliding along a path defined to run between the front two projections 92 through to between the rear two projections 94. In the side case portion 16 having a horizontal projecting portion 96 for pivotal mounting of the crank 28 in FIG. 1, there is provided an opening 98, along the edge of which opening there are provided guide concaves for the actuating members and the follow-up members. Further, between the side case portions 12' and 14', there is fixedly mounted an L-shaped plate 102 having openings 100 for receiving the other ends of the actuating members and the follow-up members, and, also, there is rockably mounted a rocking member 104 for allowing the movement of the carriage 22 to be carried out as will be stated hereinafter.

FIG. 7 shows a modification of the holding plate 90 in FIG. 6. A holding plate 90a has a pair of mounting slots 88a corresponding to the mounting slots 88 in the holding plate 90. The holding plate 90 in FIG. 6 has two pairs of projections 92 and 94 provided in front and in the rear respectively for each actuating member and, between said respective pairs of projections, there is a sliding path defined for the actuating member to slide therealong, whereas, in the holding plate 90a in FIG. 7, there is a curved portion 90b provided at the front end, and, along the free end of said curved portion, there are provided five concaves 90c. These concaves 90c are in registration with the corresponding concaves in the side case portion 16 and the corresponding openings 100 in the fixed L-shaped plate 102 so as to define a limited sliding path for the respective actuating member.

Figure 9:
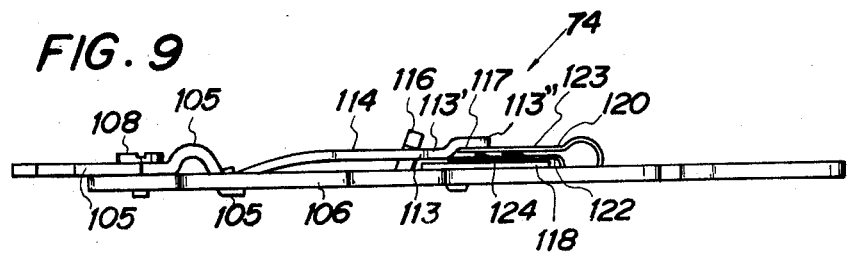
Figure 10A:
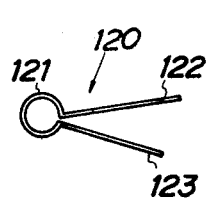
Figure 10B:
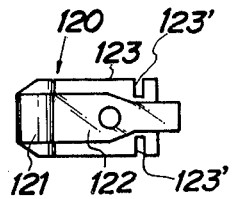
Figure 10C:
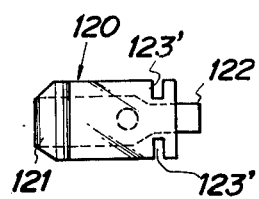

FIGS. 8–10 show a follow-up member usable in the tuner of the embodiment of this invention in FIG. 1. As stated above, the follow-up member is provided in a pair on both sides of each actuating member, either of which pair of follow-up members is engaged with the associated actuating member by the broadcast band selecting mechanism section to be stated hereinafter in accordance with a selected broadcast band, and is allowed to slide with the sliding of the actuating member, and, accordingly, with the push-in of a pushbutton, so that the fan-shaped cam of the follow-up member concerned allows the rocking member 104 in FIG. 5 to rock in response to the position of said cam to thereby move the carriage 22 correspondingly and change the degree of insertion of the tuning core to carry out the station selection.

The above-mentioned fan-shaped cam compels the rocking member 104 to rock, and, therefore, since the inclination of the fan-shaped cam once fixed is never permitted to change in the course of the tuning operation, it must be held positioned very firmly on the follow-up member. For this reason, the conventional one necessarily had disadvantages such that it, being very complicated, requires small members in large numbers, that it takes much time to finish the assembling operation, and so forth.

The follow-up member of the illustrated embodiment of this invention is constructed so that, in fixing a fan-shaped cam onto the follow-up member at a predetermined angle, a spring plate in perculiar form is inserted between a fixing plate of strong elasticity and the fan-shaped cam to make it possible to carry out the fixing of the fanshaped cam very easily.

FIGS. 8 and 9 show a follow-up member 74. This follow-up member includes a shaped part 105 and a shaped part 106. The shaped part 105 has a screw 108 to provide a relatively movement with respect to the shaped part 106. The shaped part 105 has a slot 110 for a screw 108, and, accordingly, the position of the part 105 with respect to the part 106 is freely variable. The shaped part 105 has a curved portion 105'. The free end of the curved portion 105' is positioned in a hole in the shaped part 106 to form a receiving part 105" thereat. A fixing plate 114 is provided which is made of a material of preferably strong elasticity, said fixing plate 114 abutting at one end against said receiving part 105" in the unpressed position thereof and having a channel-like notch or cut-out 112 provided at the other end. In said notch or cut-out 112 in the fixing plate 114 is inserted a T-shaped supporting projecting plate 116 formed by cutting out and bending a part of the shaped part 106 in a T shape. Further, two legs 113 which define the notch or cut-out 112 in the fixing plate 114 form pressing portions 113' for a fan-shaped cam 118 as well as engaging portions 113" for the collapsible spring plate 120 shown in FIG. 10. The engaging portion 113" causes the leg end portions of the fixing plate 114 to be bent in stepped form, whereby a predetermined gap 117 is formed between the fan-shaped cam 118 and the fixing plate 114. In this gap 117, the two end portions of the spring plate 120 are inserted. The spring plate 120, when released, is in the state of both portions 122 and 123 being separated by the elastic action of a circular portion 121 as shown in FIG. 10a. The portion 122 of the spring plate 120, as shown in FIG. 10b and c, is somewhat longer than the portion 123, this pressing the fan-shaped cam over the entire radial length thereof. The other portion 123 is somewhat wider than the portion 122 and has notches 123' provided at the side edges thereof.

In these notches 123', in inserting the spring plate 120 in said gap 117, projections 124 provided to project inwardly to the engaging portions 113" of the fixing plate 114 are fitted, to thereby insure that the spring plate is inserted accurately in a predetermined position. In this state, the circular portion 121 of the spring plate 120 is positioned in the opening 126 of the shaped part 106.

In fixing the fan-shaped cam for presetting, it suffices if only the forward end portions of the portions 122 and 123 of the spring plate 120 are inserted in the gap 117. That is to say, with the engaging point with the supporting projecting plate 116 as a fulcrum, the engaging portion 113" of the fixing plate 114 is pushed upwardly in FIG. 9 by the elastic force of the spring plate 120. Then, the shaped part 105 is moved by the length of the slot 110 to the right with respect to the shaped part 106 so that the other end of the fixing plate 114 is mounted on the top of a curved portion 105'. Thereby the pressing portion 113' of the fixing plate 114 presses the fan-shaped cam 118 strongly against the shaped part 106, so that the fan-shaped cam 118, that is, the two cam surfaces, is fixed at a predetermined angular position. Also, to release the fan-shaped cam 118 from its pressed state, it suffices if only the shaped part 105 is moved to the left to return to the state only in the drawing, then, to position the part 122 and the part 123 thereof to come nearer from the state shown in FIG. 9, the spring plate 120 is compressed to release the engagement between the notches 123' and the projections 124, and, in that state, the spring plate 120 is drawn out to the right.

Figure 11:
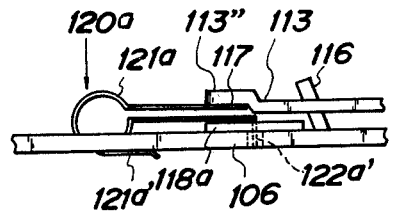
Figure 13:
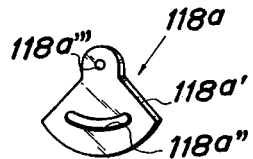
Figure 12A:
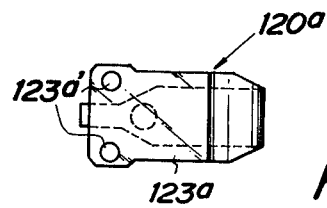
Figure 12B:
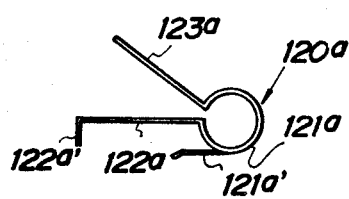
Figure 12C:
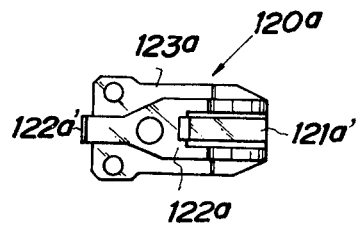

FIGS. 11–13 show an arrangement including modifications of the fan-shaped cam 118 and the spring plate 120 in FIGS. 8 – 10. As is well known, the fan-shaped cam 118 is designed to be pivotally movable on the surface of the shaped part 106 with respect to a certain one position for preset positioning-adjustment by some conventional means (refer to FIG. 13). Once positioning-adjusted, the fan-shaped cam 118 need be fixed firmly on the shaped part 106. The arrangement in FIGS. 11 – 13 retains the merits of that in FIGS. 8 – 10 and, in addition, has further provided means for preventing the shift of the spring plate 120 at the time of pressing portion 113 of the fixing plate 114 and means for preventing a fan-shaped cam 118a from effecting excessive pivotal movement at the time of the preset fixing of said cam. FIG. 11 shows the state of preset fixing of the fan-shaped cam 118a by a spring plate 120a. In this state, a right-angled bent portion 122a' at the forward end of a portion 122a of the spring plate 120a as shown in FIG. 12 extends into a hole 106' in the shaped part 106 through an elongated bent slot 118a" in the fan-shaped cam 118a. Further, a locking portion 121a' of a circular portion 121a of the spring plate 120a is engaged with the lower surface of the shaped part 106. Therefore, the fan-shaped cam 118a will not effect pivotal movement excessively with respect to 118a" due to the existence of the bent portion 122a' of the spring plate 120a at the time of the preset positioning-adjustment of the fan-shaped cam 118a, and further, due to this bent portion 122a' and the locking portion 121', it is prevented for the spring plate 120a to shift during fixing by the fixing plate 114 of the fan-shaped cam 118a thereby causing the fan-shaped cam 118a which is in a preset adjusted state to shift from said preset state.

The manual rotation tuning control mechanism section

Figure 14:
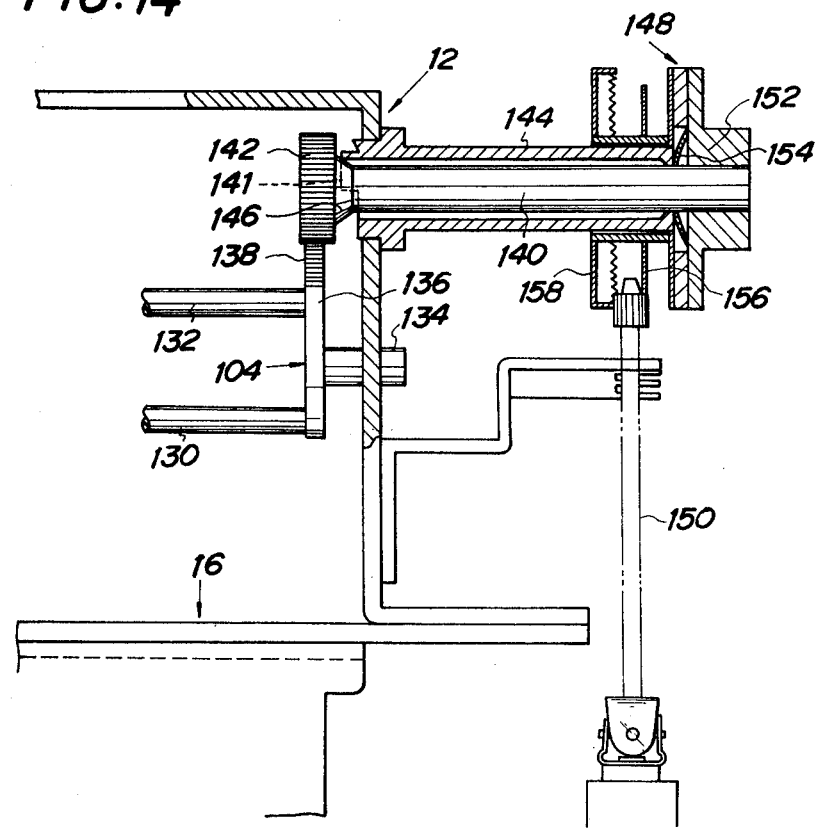
FIG. 14 is a view showing a manual rotation tuning control mechanism section.
Figure 19:
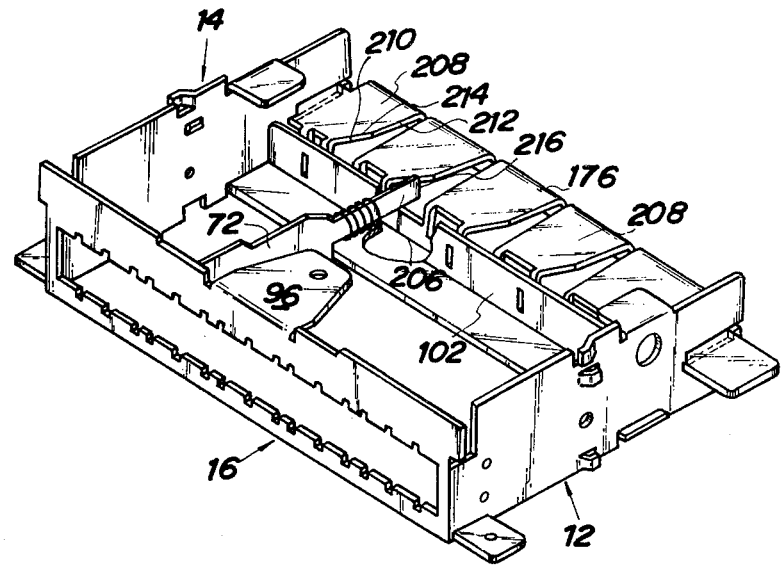

The manual rotation tuning control mechanism section is also capable of controlling the tuning mechanism section apart from the operation of the pushbuttons 70. FIG. 14 shows one embodiment of the manual rotation tuning control mechanism section usable in this invention. Between the side case portions 12 and 14, a rocking member 104 is rockably provided. This rocking member 104 consists of upper and lower rods 130 and 132 and two rotary support members 136 (only one illustrated) having said rods and two shafts 134 (only one illustrated) fixed thereto. The rotary support member 136 is operatively connected with the carriage 22 in order to change the rotation thereof to the movement of the carriage 22. The rotary support member 136 has a crank gear portion 138. This crank gear portion 138 is engaged with a gear 142 coupled to a rotary shaft 140 of such a manual rotation operating system as will be stated hereinafter. The rotation of the gear 142 causes the rocking member 104 to effect rocking through the crank gear portion 138 and moves the carriage 22 correspondingly therewith.

The arrangement shown in FIG. 14 is one constructed so as to dissolve back-lash at the engaging portion of the crank gear portion 138 and the manual rotation operating system gear 142 in a very simple mode.

In a pushbutton tuner, as mentioned above, in order to control the degree of insertion of a tuning core, it is carried out to use a rocking member (104) which is operated by a frequency defining fan-shaped cam provided to a follow-up member and, by said rocking member, to move a carriage (22) having such cores arranged in array, but, in one having such construction, in the object of appropriately changing and setting the angle of action upon the rocking member of the above-mentioned frequency defining fan-shaped cam or forming the required station-selecting and tuning state even without resorting to the pushbutton operation, in order to effect fine adjustment separately by the manual rotation operation, it is also carried out to provide a crank portion (138) to said rocking member, then to engage a gear (142) which is interlockingly moved by the rotation of a manual rotary shaft (150) with said crank gear portion, and, at the time of pushbutton operation, to operate a clutch mechanism (148) provided to this manual rotation operating system to release said manual rotation operating system and, in that state, to establish a tuning state in one-touch mode. However, in one having such construction, back-lash occurs at the engaging portion of the crank gear portion (138) provided to said rocking member (104) and the clutch-side gear (142) provided to the manual rotation operating system.

In FIG. 14, a gear sleeve 144 inside which the rotary shaft 140 extends and which is provided fixed to the side case portion 12 has formed a portion 141 projecting partially from the left end thereof and is designed to press a receiving member 152 fixed to the shaft 140 with an elastic material 154 inserted between the other end portion of said gear sleeve 144 and the receiving member 152 for said clutch mechanism 148, as well as the gear shaft 140 and the clutch-side gear 142, to the right against said portion 141, and, moreover, in said clutch-side gear 142, there is formed, between it and the gear shaft 140, an inclined surface 146 which is elastically engaged with said portion 141. The portion 141 defines an opening portion of preferably 180° which faces the crank gear portion 138. To the gear shaft 140, the rotation of a manual rotation operating shaft 150 is transmitted through a crown gear 158 and said clutch mechanism 148 under action of an elastic plate 156.

According to such construction, the inclined surface 146 of the clutch-side gear 142 provided to the gear shaft 140 having a thrust due to the elastic material 154 acts upon the portion 141 of the gear sleeve 144, whereby said clutch-side gear 142 is biased to the right side at all times, whereby back-lash between the gears 142 and 138 can be dissolved effectively. As said elastic material 154, use may be made, not only of such a dishlike spring as is illustrated, but also of a rubber or synthetic resin molded material or a coil spring. The elastic strength of this elastic material 154 makes it possible, even after assembling, appropriately, to remove the receiving member 152 from the shaft 140 and change or adjust the same, and, by the adjusting of said elastic strength, the engaging force between said two gears 142 and 138 can be changed freely, whereby a desirable interlocking relationship between the two gears can be maintained.

Another embodiment of the manual rotation tuning control mechanism section is shown in FIGS. 15 and 16. In these figures, a carriage 22 is mounted slidably by a guide rod 26. To the carriage 22, tuning cores 24 are mounted. As stated above, the moving operation of such carriage 22 is effected by the rotation of a rocking member. To this rocking member, a crank gear support member 136 is mounted, and a crank gear portion 138 is engaged with a gear 142 mounted to the forward end portion of a rotary shaft 140. A friction plate of a shaft sheath 160 which is coaxial with said rotary shaft 140 faces a receiving member 152 fixed to the other end of the rotary shaft 140. To the shaft sheath 160, a crown gear 158 and an elastic plate 156 are mounted, and, between said crown gear 158 and said elastic plate 156, a pinion gear 164 at the forward end of a manual rotary shaft 150 is positioned. The pinion 164 has a projection 166 formed thereon, which projection 166 receives a pressing force due to the elastic plate 156 to engage the pinion gear 164 with the crown gear 158. At one end portion of the shaft sheath 160, there is formed a constricted portion 168, with which a clutch lever 170 is engaged. The clutch lever 170 is supported through a pivotal support space 174 to a support member 172 extending so as to project from the side case portion 12. The clutch lever 170 is engaged at its right end portion with a switching plate 176. The switching plate 176 slide-moves in response to the push-in of a pushbutton, to move the shaft sheath 160 in opposition to the elastic force of a spring 178. With respect to the locking between the clutch lever 170 and the shaft sheath 160, an opening portion 171 is provided to the clutch lever 170 at a position corresponding to said constricted portion 168, and, above and below said opening portion 171 and, as shown in FIG. 16, at positions offset to the pinion gear 164 (or clutch lever 170-supporting pivotal support space 174) side from the shaft sheath 160 and the shaft-center position of the rotary shaft 140, engaging projections 180 are oppositely provided which are engaged with the constricted portion 168.

In such construction, the force for clutch switching to be applied to the shaft sheath 160 from the switching plate 176 is applied to a position offset to the pinion gear 164 from the shaft-center position of the shaft sheath 160. Accordingly, the force for separating the friction plate 162 from the above-mentioned receiving member 152 is also offset to the pinion gear 164 side. That is to say, even under the above-mentioned condition that, by the elastic force due to the elastic plate 156, the pinion gear 164 is always pressed towards the crown gear 158, the said separating force is offset to the pinion gear 164 side as mentioned above, so that a clutch disengagement between the receiving member 152 and the friction plate 162 is provided uniformly as a whole.

FIGS. 17 and 18 are views for explaining a crown gear engaging mechanism. Particularly, the construction in FIG. 17 provides a mechanism capable of establishing and maintaining an always-stabilized engaged relationship between a pinion gear and a crown gear even if the direction of a rotary operating shaft for rotation adjustment is changed.

As stated above, the manual rotation operating control mechanism section engages a pinion gear of a rotary shaft to be rotated manually with a crown gear to be coupled to the tuning mechanism section by an elastic plate, but such press-engagement of a pinion gear with a crown gear by an elastic plate is usually carried out in such a manner that, typically, as shown in FIG. 18, a projection 166 in tapered form at the forward end of a pinion gear 164 is pressed against the peripheral edge portion of a single elastic plate 156 and thereby engaged with a crown gear 158. However, in such typical arrangement, if, generally, the direction of the rotary shaft 150 is changed like $a - c$ as shown in FIG. 18, then, because the pinion gear 164 and its projection 166 are in fixed form, the pressing force received from the elastic plate 156 changes variously. Particularly, in the case where the rotary shaft 150 takes the direction of $c$, the projection 166 causes the elastic plate 156 to bend greatly as shown with an imaginary line. In any event, depending upon the direction of the rotary shaft 150, a change is brought about in the press-engaged relationship between the pinion gear 164 and the crown gear 158.

The construction in FIG. 17 dissolved the dissadvantages of that in FIG. 18. In FIG. 17, the relationship for a pressing mechanism consisting of elastic plates to press the projection 166 projecting from the pinion gear 164 of the rotary shaft 150 against the crown gear 158 is the same as in the one in FIG. 18, but, in the construction in FIG. 17, such pressing mechanism 184 is constructed of a plurality of elastic plates 184a, 184b . . . 184n of different diameters. These are assembled superposed one upon another in such a manner that the elastic plates 184b . . . 184n of different diameters are placed in sequence upon the outer side of the largest elastic plate 184a to be engaged with the projection 166, to thereby insure the engagement between the pinion gear 164 and the crown gear 158 by such pressing mechanism 184.

According to such construction, the pressing force due to the elastic plate 184a of the largest diameter is to be strengthened by the action of the elastic plates 184b . . . 184n of smaller diameters. Accordingly, even in the case where the rotary shaft 150 takes the direction of c, the occurrence of unrecoverable bending in the elastic plates is avoided, and, also, as the auxiliary pressing forces of the elastic plates 184b . . . 184n are proportional to the degree of bending of the elastic plate 184a, pressing forces in wide range as a whole are formed, so that, regardless of the direction of the rotary shaft 150, an always-stabilized engaged relationship between the pinion gear 164 and the crown gear 158 can be established.

Next, referring to FIG. 1 again, the rear upper case portion 18 has projecting members 186 in a settable mode on the upper surface thereof, and the carriage 22 has a projecting portion 188 at the right end thereof. The rocking member 104 also has lateral projecting portions 202, which are received in notches provided in the carriage 22. When the rocking member 104 rotates to plane-move the carriage 22, the lateral projecting portion 202 move up and down with respect to the surface of the carriage 22, so that, in that case, in order to maintain the operative coupling state of the carriage 22 and the rocking member 104, springs 200 are provided. These springs are coupled at one ends to the carriage 22 and at the other ends to the lateral projecting portions 202. The movement of the carriage 22 is restricted by the abutting of the lateral projecting portions 202 against the projecting member 186 of the case portion 18 and the abutting of the projecting portion 188 of the carriage 22 against the case portion 16.

FIGS. 19 – 23 are views for explaining an embodiment of the above-mentioned switching plate 176 (FIGS. 15 – 16) usable in the pushbutton tuner of this invention.

As stated above, the operation of the pushbutton tuning mechanism section having pushbuttons 70 and the operation of the manual rotation tuning control mechanism section having a rotary tuning shaft 150 are carried out independently of each other by clutch mechanism 148. In pushbutton operation, it is necessary that the clutch mechanism be operated simultaneously to render the manual rotation tuning control mechanism section into an inoperative, and thereafter realize a station-selecting and tuning operation by a pushbutton. For this reason, a switching plate 176 is slidably provided, and, by this switching plate, such disengagement as is mentioned above becomes possible. The switching plate 176 is provided with cam portions which cooperate with the forward end portions of respective actuating members having pushbuttons. Each cam portion of the switching plate has an edge formed linearly from a single inclination as shown in FIG. 23, but, in such construction, though the object clutch switching can be realized by the pushbutton operation, there are disadvantages such that, due to irregularity in, for example, the length of the actuating member or the pitch thereof, an appreciable difference is caused in the action upon the switching plate so that a smooth switching operation cannot be secured, that slipping occurs, that the adjustment of the switching plate is difficult, and so forth, so that smoothness is hard to realize in the pushbutton operation.

Figure 21:
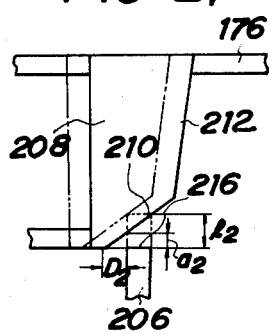
Figure 22:
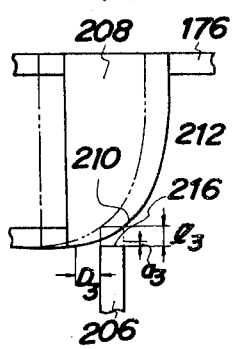

The construction in FIGS. 19 – 22 dissolves such disadvantages of the conventional one as are mentioned above. In FIGS. 19 – 22, an optional number (for example, five) of actuating members 72 are slidably arranged between the side case portions 12 and 14. A switching plate 176 is provided with driven portions 208 which cooperate with the forward end portions 206 of the actuating members 72 respectively. In each driven portion 208, there is formed a cam edge 214 which consists of a cam portion 210 which takes a steep inclination, and a cam portion 212 which takes a slow inclination, with respect to the advancing direction of the actuating member 72. This cam edge 214 is to be engaged with an actuating end 216 of the forward end portion 206 of the actuating member 72. As a definite construction of the cam edge 214, in addition to its being composed of linear cam portions 210 and 212 as shown in FIG. 21, it may also be made by forming a series of cam portions 210 and 212 with an appropriate curve, for example, parabola, as shown in FIG. 22.

Figure 23:
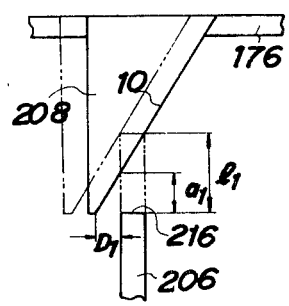

In pushing in the actuating member 72 to effect a station-selecting and tuning operation, the cam portion 210 which takes a steep inclination with respect to the advancing direction of said actuating member is first brought into contact with the actuating end 216 of the forward end portion 206 of said actuating member, whereby the degree of sliding of the switching plate 176 can be made fairly great with respect to the push-in depth, that is, the degree of push-in of the actuating member necessary to obtain the same degree of sliding $D_1 - D_3$ can be reduced like from $1_1$ to $1_2$ or $1_3$ as shown in comparison in FIGS. 21 – 23, thus realizing the object sliding of the switching plate 176 with a little degree of push-in, so that, even if, in the length of the actuating member 72 or the pitch thereof, there is irregularity in its own way, it is possible, by covering such irregularity fully, to realize an accurate switching operation at all times. After such accurate switching operation is thus realized at the cam portion 210, the cam portion 212 and the actuating end 216 are brought into contact with each other, then the push-in resistance of the actuating member 72 is strikingly reduced, so that, at such point in time, the station-selecting operation to be realized between the frequency defining fan-shaped cam 118 and the rocking member 130 or 132 is relatively easily realized, and the pushbutton operation, too, becomes smooth as a whole.

Figure 25:
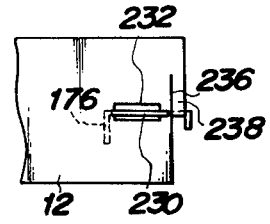
Figure 26:
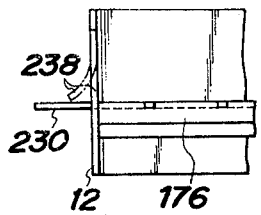

FIGS. 24 – 26 show a preferable embodiment for mounting a switching plate 176 slidably between right and left side case portions.

In the rear end portions of the side case portions 12 and 14, there are formed insertion slots 232 for inserting respective elongated portions 230 on both sides of the switching plate 176. In these insertion slots 232, opening portions 234 are formed respectively which are directed towards the rear end edges of the respective side case portions, and, adjacent to said opening portions, outwardly bent portions 238 are provided respectively which are made strip-like respective cut lines 236.

The bent portion 238 is held bent as shown with an imaginary line in FIG. 24 or FIG. 26, whereby the opening portion 234 formed in the insertion slot 232 is completely opened, and, accordingly, through such opening portion 234, the elongated portion 230 of the switching plate 176 can be inserted freely into said insertion slot 232. After the elongated portion 230 is thus inserted, the bent portion 238 is straightened like a solid line in FIG. 25 or FIG. 26 to close said opening portion 234; thus, the switching plate 176 can be mounted slidably.

The tuner of this invention has a broadcast band selecting mechanism section having shift means for selecting either broadcast band of FM and AM manually. This broadcast band selecting mechanism section has toggle levers each for coupling an actuating member to either of the follow-up members on both sides thereof in response to the lateral shift of the shift means.

FIG. 27 shows one actuating member 72 having a pushbutton (not shown) at the left end and follow-up members 74 on both sides thereof and a toggle lever 240. A shaped part 105 and the same 106 of the upper follow-up member 74 are shown in the unpressed state of a fan-shaped cam (not shown), and the lower follow-up member 74 is shown in the pressed state.

FIG. 28 shows shift means 242. A toggle lever 240 emgages an actuating member 72 with a follow-up member 74 on the left side by the shift means 242 having been shifted in the direction of a solid line. A shaped part 105 of the follow-up member 74 has a notch 246 adopted to receive the toggle lever 240. In the inoperative position of the actuating member 72, this is, in the position thereof when a pushbutton is not pressed, the notches of a follow-up member pair are in registration with each other so that the toggle lever 240 can pivotally move to enter either notch selectively.

Preferably five actuating members 74 have support portions 246' (FIG. 27) for supporting the toggle levers 240 articulately mounted thereon respectively. This support portion 246' has a concave 248, in which concave the toggle lever 240 is pivoted with respect to a shaft 250.

The shift means 242 is capable of pivotally moving all of the toggle levers 240 at the same time. The shift means 242 can be moved in the dotted-line direction $X_2$ from the state in FIG. 28 manually, and, accordingly, the toggle lever 240 enters a notch in the follow-up member on the right side. The position of the toggle lever in that state is shown with an imaginary line.

The upper surface of the toggle lever 240 forms a cam surface 252. The shift means 242 has a roller 245 for engaging with said cam surface. When the shift means 242 shifts in the dotted-line direction $X_2$ for broadcast band switching, the roller 254 moves to a dotted-line position, whereby the toggle lever 240 moves round clockwise with respect to a point 250 to enter the notch in a shaped part 105 of the follow-up member on the right side.

According to the peculiar construction of the embodiment of this invention, at the time of the slide movement of the actuating member, the toggle lever 240 is engaged at a part thereof with the upper end of the follow-up member (in the drawing, the follow-up member on the right side) which is in an uncoupled state, and slides therealong. This engagement maintains the contact of the bottom of the notch 246 in the follow-up member (on the left side) which is in a coupled state with a portion 256 on the left side of the toggle lever during slide stroke of the actuating member.

For this purpose, the position relationship between the actuating member 72 and the two follow-up members, the shape of the notch contact portion 256 of the toggle lever 240, the depth of the notch 246, and the relative position of the toggle lever slide contact portion (258 in FIG. 29) of the follow-up member are selected.

Further, according to this invention, the depth of the notch 246 is such that, as is clear from the drawing, in the course of the pivotal movement of the toggle lever 240, both portions 256 thereof are always positioned in both notches 246 respectively.

FIGS. 30 and 31 show a modification of the arrangement in FIG. 28. One portion 256 of a toggle lever 240 is inserted in a notch 246 in one follow-up member. Shift means 242 includes one toggle level 240-actuating means per toggle lever. This toggle lever actuating means is disposed in a toggle lever pivotal movement enabling position forwardly of each shift means movement prohibiting member 272 shown in FIG. 31, and includes screw means 268 for supporting the toggle lever actuating member 264 which corresponds to the roller 254 in FIG. 28. The screw means has a coil spring 270 disposed by being compressed between the back surface of the shift means movement prohibiting member 272 and the toggle lever actuating member 264. The member 264 is capable of moving upwardly with respect to the shift means 242 in opposition to the force of the spring. When the member 264 moves on a cam surface 252 of the toggle lever 240 with the movement of the shift means 242, this upward movement of the member 264 insures a smooth pivotal movement of the toggle lever 240.

The shift means 242 shown in FIG. 31 is mounted slidably in lateral direction on a plate 280 on the upper surface of the support section. In FIG. 31, the shift means 242 is capable of moving to the left through a manual operating portion 262. For this purpose, the plate 280 is provided with a slot 284, in which slot the shift means 242 is mounted by a screw 282.

The shift means 242 is provided with preferably five shift means movement prohibiting members 272 extending in the slide direction of actuating members. The shift means 242 may be made of a piece of plate. This shift means movement prohibiting member 272 acts in such a manner that, during the time the actuating member is sliding in response to the operation of a pushbutton, that is, at the time the toggle lever is positioned on a toggle lever slide engaging portion 258 of the uncoupled follow-up member, the shift means, even if it attempts to move, is prevented from such movement by this member 272 being engaged with the associated toggle lever in a fixed state. Preferably, between the shift means 242 and the support section, spring means (not shown) is provided, said spring means acting to bias the shift means towards either of the broadcast band selecting positions.

I claim:

1. A dual band pushbutton tuner comprising: a frame; a plurality of actuating members each having a pushbutton mounted thereon, said actuating members being capable of moving with respect to said frame; a pair of follow-up members arranged on opposite sides of each actuating member and each having a notch therein; toggle means articulately mounted to each actuating member; shift means for moving all of the toggle means at the same time to position portions of said toggle means into or out of a notch in the follow-up members on one or the other side of each actuating member to thereby couple the actuating member to one of the associated pair of said follow-up members and to uncouple the same from the other associated follow-up member; and holding means for fixing and maintaining the toggle means of any actuating member in its adjusted position while the associated and coupled follow-up member is moved thereby said holding means being so constructed that the toggle means of each actuating member slides on the associated and uncoupled follow-up member as the actuating member is operated.

2. The dual band pushbutton tuner of claim 1 wherein said notches in each pair of follow-up members associated with each of said actuating members are in initial alignment prior to the operating of each actuating member by depression of the associated pushbotton, each associated toggle means having portions mounted for movement within or outside of the aligned notches of the associated pair of follow-up members, the portion of each toggle means which moves without a notch engaging and sliding against the follow-up member which is uncoupled therefrom when the associated actuating member and the coupled follow-up member are moved relative to the uncoupled follow-up member by depression of the associated pushbutton, the uncoupled follow-up member acting as a rigid locking means preventing the return movement of the toggle lever until the return of the associated actuating member to its intial position when the notches in the follow-up members becomes re-aligned.

3. The dual band pushbutton tuner of claim 2 wherein said shift means includes means for preventing, during the movement of any actuating member by depression of the associated pushbutton, the shift means from moving, said means including a portion of said shift means which slidably abuts a portion of the toggle means when the toggle means is held against return movement by its slidable engagement with the uncoupled follow-up member.

* * * * *